US009627420B2

(12) United States Patent
Kerr et al.

(10) Patent No.: US 9,627,420 B2
(45) Date of Patent: Apr. 18, 2017

(54) METHOD FOR FORMING AN ELECTRONIC DEVICE ON A FLEXIBLE SUBSTRATE SUPPORTED BY A DETACHABLE CARRIER

(75) Inventors: Roger Stanley Kerr, Brockport, NY (US); Timothy John Tredwell, Rochester, NY (US)

(73) Assignee: Carestream Health, Inc., Rochester, NY (US)

( * ) Notice: Subject to any disclaimer, the term of this patent is extended or adjusted under 35 U.S.C. 154(b) by 1730 days.

(21) Appl. No.: 12/028,194

(22) Filed: Feb. 8, 2008

(65) Prior Publication Data

US 2009/0200550 A1    Aug. 13, 2009

(51) Int. Cl.
*H01L 27/12* (2006.01)
*H05K 3/00* (2006.01)
*H05K 1/03* (2006.01)
*H01L 29/786* (2006.01)

(52) U.S. Cl.
CPC ...... *H01L 27/1266* (2013.01); *H01L 27/1214* (2013.01); *H01L 29/78603* (2013.01); *H05K 1/0353* (2013.01); *H05K 1/0366* (2013.01); *H05K 3/007* (2013.01); *Y10T 29/49155* (2015.01)

(58) Field of Classification Search
CPC . H01L 21/02; H01L 27/1214; H01L 27/1266; H01L 29/78603; H01L 51/0028; H01L 2224/03848; H05K 1/0366; H05K 1/0353; Y10T 29/49155; B32B 37/06
USPC .................................................. 29/830, 832
See application file for complete search history.

(56) References Cited

U.S. PATENT DOCUMENTS

| 5,391,257 | A | * | 2/1995 | Sullivan | ............ H01L 21/76251 |
| | | | | | 117/915 |
| 5,817,550 | A | * | 10/1998 | Carey et al. | ................... 438/166 |
| 5,937,512 | A | * | 8/1999 | Lake et al. | ....................... 29/832 |
| 6,492,026 | B1 | | 12/2002 | Graff et al. | |
| 6,680,485 | B1 | | 1/2004 | Carey et al. | |
| 6,762,124 | B2 | | 7/2004 | Kian et al. | |
| 6,769,174 | B2 | * | 8/2004 | Siegel | .................... H01L 21/566 |
| | | | | | 257/E23.124 |
| 6,846,549 | B2 | * | 1/2005 | Tani | ......................... B32B 15/04 |
| | | | | | 174/258 |
| 7,045,442 | B2 | | 5/2006 | Maruyama et al. | |
| 2002/0092962 | A1 | * | 7/2002 | Domeier et al. | ................ 249/60 |
| 2005/0266591 | A1 | * | 12/2005 | Hideo | ............... G02F 1/136277 |
| | | | | | 438/22 |

(Continued)

FOREIGN PATENT DOCUMENTS

JP           07-325297           12/1995

OTHER PUBLICATIONS

U.S. Appl. No. 11/461,080, filed Jul. 31, 2006, titled: Flexible Substrate With Electronic Devices Formed Thereon, by Timothy John Tredwell et al.

(Continued)

*Primary Examiner* — Peter DungBa Vo
*Assistant Examiner* — Jeffrey T Carley

(57) ABSTRACT

A method for forming an electronic device provides a carrier formed from a composite material comprising a plastic binder and an embedded material. A substrate material is attached to the carrier. The substrate is processed to form the electronic device thereon. The substrate is then detached from the carrier to yield the resultant electronic device.

25 Claims, 11 Drawing Sheets

(56) References Cited

U.S. PATENT DOCUMENTS

2006/0280936 A1* 12/2006 Lim ..................... H05K 3/007
428/349

OTHER PUBLICATIONS

U.S. Appl. No. 12/028,182, filed Feb. 8, 2008 titled: Method of Forming an Electronic Device on a Substrate Supported by a Carrier and Resultant Device, by Timothy John Tredwell et al.
U.S. Appl. No. 11/538,173, titled: Flexible Substrate With Electronic Devices and Traces, filed Oct. 3, 2003, by Roger Scott Kerr et al.

* cited by examiner

METHOD FOR FORMING AN ELECTRONIC DEVICE ON A FLEXIBLE SUBSTRATE SUPPORTED BY A DETACHABLE CARRIER

CROSS REFERENCE TO RELATED APPLICATIONS

Reference is made to U.S. patent application Ser. No. 11/461,080 by Kerr et al. entitled FLEXIBLE SUBSTRATE WITH ELECTRONIC DEVICES FORMED THEREON, filed Jul. 31, 2006; and U.S. patent application Ser. No. 11/538,173 by Kerr et al. entitled FLEXIBLE SUBSTRATE WITH ELECTRONIC DEVICES AND TRACES, filed Oct. 3, 2006; and U.S. patent application Ser. No. 12/028,206 by Kerr et al entitled METHOD FOR FORMING CAST FLEXIBLE SUBSTRATE AND RESULTANT SUBSTRATE AND ELECTRONIC DEVICE, filed Feb. 8, 2008.

FIELD OF THE INVENTION

This invention generally relates to electronic device fabrication and more particularly relates to a method for forming such a device on a flexible substrate and the resultant device.

BACKGROUND OF THE INVENTION

Thin-film transistor (TFT) devices are widely used in switching or driver circuitry for electro-optical arrays and display panels. TFT devices are conventionally fabricated on rigid substrates, typically glass or silicon, using a well-known sequence of deposition, patterning and etching steps. For example, amorphous silicon TFT devices require deposition, patterning, and etching of metals, such as aluminum, chromium or molybdenum; of amorphous silicon semiconductors; and of insulators, such as $SiO_2$ or $Si_3N_4$, onto a substrate. The semiconductor thin film is formed in layers having typical thicknesses ranging from several nm to several hundred nm, with intermediary layers having thicknesses on the order of a few microns, and may be formed over an insulating surface that lies atop the rigid substrate.

The requirement for a rigid substrate has been based largely on the demands of the fabrication process itself. Thermal characteristics are of particular importance, since TFT devices are fabricated at relatively high temperatures. Thus, the range of substrate materials that have been used successfully is somewhat limited, generally to glass, quartz, or other rigid, silicon-based materials.

TFT devices can be formed on some types of metal foil and plastic substrates, allowing some measure of flexibility in their fabrication. However, problems such as chemical incompatibility between the substrate and TFT materials, thermal expansion mismatch between substrate and device layers, planarity and surface morphology, and capacitive coupling or possible shorting make metal foil substrates more difficult to employ in many applications.

The fabrication process for the TFT may require temperatures in the range of 200-300 degrees C. or higher, including temperatures at levels where many types of plastic substrates would be unusable. Thus, it is widely held, as is stated in U.S. Pat. No. 7,045,442 (Maruyama et al.), that a TFT cannot be directly formed on a plastic substrate. In order to provide the benefits of TFT devices mounted on a plastic substrate, the Maruyama et al. '442 disclosure describes a method that forms the TFT on a release layer that is initially attached to a carrier substrate. Once the TFT circuitry is fabricated, the release layer is then separated from its carrier substrate and can be laminated onto a lighter and more flexible plastic material.

As one alternative solution, U.S. Pat. No. 6,492,026 (Graff et al.) discloses the use of flexible plastic substrates having relatively high glass transition temperatures Tg, typically above 120 degrees C. However, the capability for these substrates to withstand conventional TFT fabrication temperatures much above this range is questionable. Moreover, in order to use these plastics, considerable effort is expended in protecting the substrate and the device(s) formed from scratch damage and moisture permeation, such as using multiple barrier layers.

Another alternative solution is described in U.S. Pat. No. 6,680,485 (Carey et al.) In the method described in the Carey et al. '485 disclosure, energy from a pulsed laser source is used to form amorphous and polycrystalline channel silicon TFTs onto low-temperature plastic substrates. The conventional, low-temperature plastic substrates for which this method is described include polyethylene terephthalate (PET), polyethersulfone (PES), and high density polyethylene (HDPE), for example.

Similarly, U.S. Pat. No. 6,762,124 (Kian et al.) discloses a process using an excimer laser to ablate a material through a mask to form a patterned conductor or semiconductor material for TFT formation onto a substrate. In the Kian et al. '124 disclosure, the substrate that is used is a composite, "glass replacement" material that may have a flexible or rigid plastic material supplemented with one or more barrier and protective layers.

Although these and similar solutions have been proposed for forming TFT components on flexible substrates, drawbacks remain. Lamination of a release layer that is populated with TFT devices, as described in Maruyama et al. '442 requires additional fabrication steps and materials and presents inherent alignment difficulties. The use of high-performance plastics, such as that of the Graff et al. '026 disclosure, still leaves thermal expansion (expressed as Coefficient of Thermal Expansion, CTE) difficulties and requires additional layers and processes in order to protect the plastic. The excimer laser solutions proposed in the Carey et al. '485 and Kian et al. '124 disclosures do not provide the full breadth of capabilities of more conventional TFT fabrication techniques and thus have limited utility. None of these disclosures provides a flexible substrate that truly serves to replace glass or other silicon-based substrate, since the TFT must be formed either on a release layer or on some intermediate layer that must be formed on top of the flexible substrate.

TFT fabrication onto flexible substrates generally requires that the substrate be held on a carrier of some type during the various stages of layer deposition. One of the more important functions of such a carrier is providing dimensional stability to the flexible substrate. Thus, for example, a rigid glass carrier is conventionally provided. As described in Japanese Patent Publication Number JP 7-325297 A2 (Ichikawa), TFT devices can be formed onto a plastic substrate temporarily held to a glass carrier by means of an adhesive layer.

The use of a glass carrier imposes some constraints on the types of flexible substrate materials that can be used. Some types of plastics are compatible with the use of a glass substrate, but can be impractical because they exhibit transition Tg temperatures near the region of temperatures used for deposition. Thus, plastic substrates can tend to soften somewhat, allowing expansion during a fabrication cycle. Metals do not have this disadvantage. However, metallic materials are not as dimensionally "forgiving" with change in temperature. A significant difference in coefficient of thermal expansion (CTE) between metals and glass results in excessive stress that can shatter glass or can cause a metal substrate to release from a glass carrier prematurely, losing its dimensional stability.

Thus, it can be seen that although there has been great interest in developing and expanding the use of both plastics and metals as flexible substrates, compatibility with a conventional glass carrier imposes some constraints on substrate material type. For this reason, there is a need for carrier materials, other than glass, that can be employed for TFT fabrication onto flexible substrates.

SUMMARY OF THE INVENTION

An object of the present invention is to provide a method for forming an electronic device comprising steps of forming a carrier from a composite material comprised of a plastic binder and an embedded material; laminating or otherwise attaching a flexible substrate to the carrier; processing the substrate to form the electronic device thereon; and delaminating or otherwise detaching the substrate and device from the carrier.

Another object of the present invention is to provide an electronic device fabricated onto a flexible substrate. The range of flexible substrates available using embodiments of the present invention can include various types of metal, including some types of metal foil, and other very thin substrates.

An advantage of the present invention is that it provides a carrier suitable for processing a flexible substrate at high temperatures, wherein the carrier can also be fabricated in such a way as to adjust its CTE characteristics.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

It is to be understood that elements not specifically shown or described in the following detailed description may take various forms well known to those skilled in the art.

Figures given in this application are representative of overall spatial relationships and arrangement of layers for deposition onto a substrate and may not be drawn to scale. As the term is used in the present description, "plastic" refers to a material having a high polymer content, usually made from polymeric synthetic resins, which may be combined with other ingredients, such as curing agents, fillers, reinforcing agents, colorants, and plasticizers. A "resin" is a synthetic or naturally occurring polymer. Plastic is solid in its finished state, and at some stage during its manufacture or processing into finished articles, can be shaped by flow. Plastics are typically formed using a curing process, in which a solvent is evaporated at a suitable rate. Plastic includes thermoplastic materials and thermosetting materials. The term "flexible" refers generally to sheet materials that are thinner than about 1.5 mm.

Figure 1:
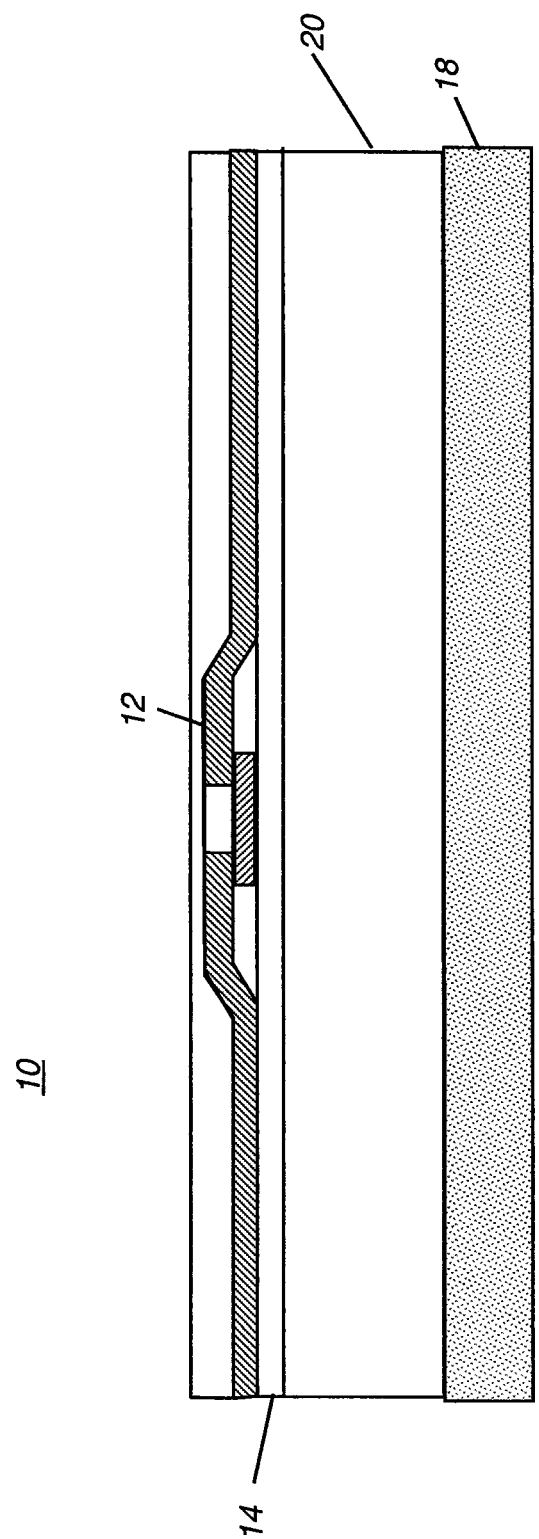
FIG. 1 is a side view of an electronic device formed on a flexible substrate supported on a carrier.

Referring to FIG. 1, there is shown an electronic device 10 formed according to the present invention. A thin-film component 12, such as a conductor, a thin-film transistor, a diode, or other component, is formed onto a flexible substrate 20 such as a metal foil. A layer 14 of silicon nitrate, for example, may be provided between component 12 and substrate 20, as will be discussed in detail later in this application. During device fabrication, substrate 20 is provided on, deposited on, laminated to, or otherwise attached to a carrier 18 that provides dimensional stability for substrate 20 over the range of processing temperatures and conditions required for thin-film device manufacture. Various techniques for attaching substrate 20 to carrier 18 are disclosed in accordance with the present invention.

The apparatus and method of the present invention provide carrier 18 having properties that are favorable for TFT fabrication, where carrier 18 is usable with substrates made from a range of metal and plastic materials, including flexible materials. By matching, or substantially matching, the coefficient of thermal expansion (CTE) of the flexible substrate, the apparatus and method of the present invention provide a carrier that adapts to the substrate and holds the substrate in position during fabrication processes without adverse effects due to the changing temperature range.

According to embodiments of the present invention, carrier 18 is a composite material that comprises both a binder and an embedded or filler material. The embedded material may be in particulate form, in stranded or woven form, in sheet or plate form, or in some other form. The CTE of the filler material can be selected to closely match the CTE of substrate 20. The CTEs of the embedded material and substrate 20 can be considered substantially equal if they are within about +/−2 ppm/degree C. for a metal substrate, more preferably within about +/−1 ppm/degree C. This combination allows CTE characteristics of the composite material to be adjusted or tuned for compatibility with CTE characteristics of substrate 20. In addition, depending on the binder materials that are selected, the composition of carrier 18 can be optimized to allow lamination and delamination of substrate 20 to and from carrier 18, without the need for a separate lamination or adhesive material in some embodiments.

With various embodiments of the present invention, a high structural rigidity of the materials of carrier 18 can be obtained along with favorable CTE characteristics, with advantages in both cost and performance. Carrier 18 of the present invention is intended to allow one-time use or to be reused any number of times, as determined by factors such as the various materials used, cost considerations, and fabrication conditions encountered. In some embodiments, substrate 20 itself can first be formed by deposition of a thin layer of material onto carrier 18, followed by fabrication of the TFT device onto the thin substrate layer.

Characteristics of Materials for Forming Carrier

The apparatus and method of the present invention can utilize any of a number of combinations of binder and embedded materials for forming a composite carrier for a flexible substrate. Combining binder and embedded materials provides a carrier structure that has particular advantages that may not be available when using a single material, including providing a surface having properties advantageous for lamination and adhesion. The composite carrier formed from binder and embedded materials according to the present invention is also advantaged because CTE and other thermal properties can be adaptable, based on the type and amount of embedded material and its formulation. By adding an appropriate amount of an embedded material to a plastic, as is described subsequently, the method of the present invention allows an expanded list of plastic materials to be used for carrier 18 and allows characteristics of these plastic materials to be supplemented or altered by the embedded material to better suit the requirements of carrier use.

Figure 2A:
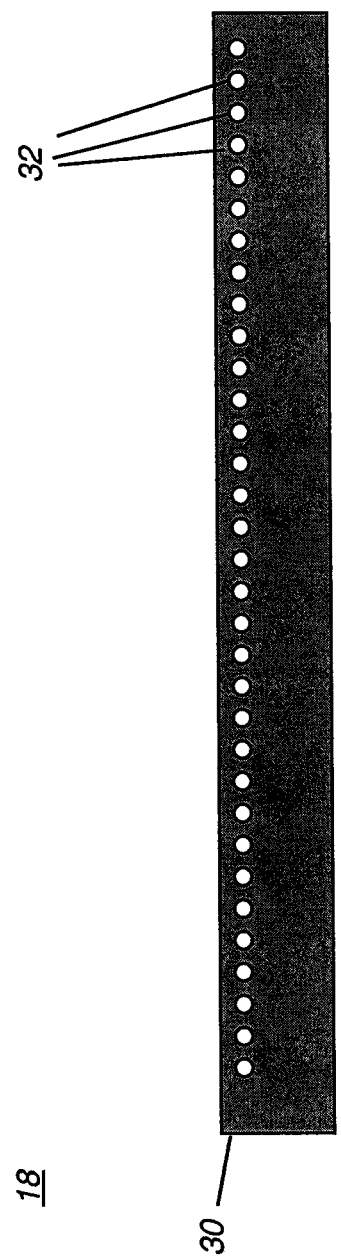
FIG. 2A is a side view of a composite carrier having a binder and embedded particulate material.
Figure 2B:
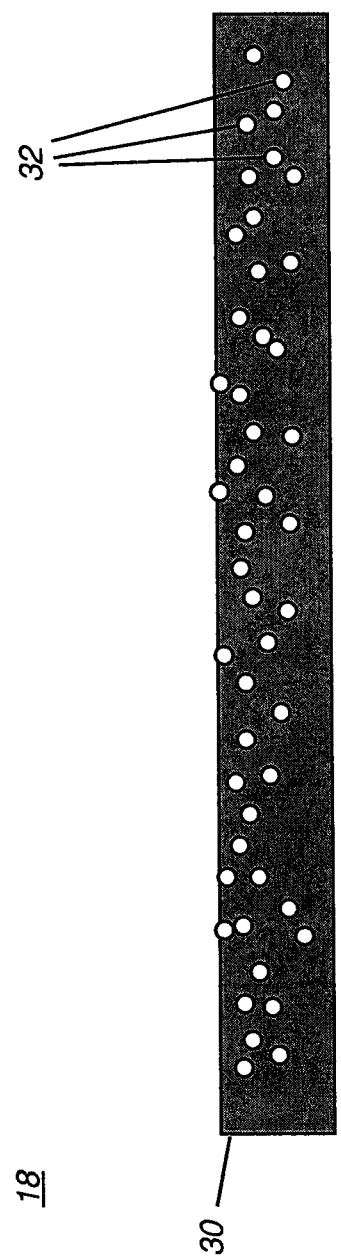
FIG. 2B is a side view of a composite carrier having a binder and embedded particulate material wherein some of the embedded particulate material is on the surface of the carrier.
Figure 2C:
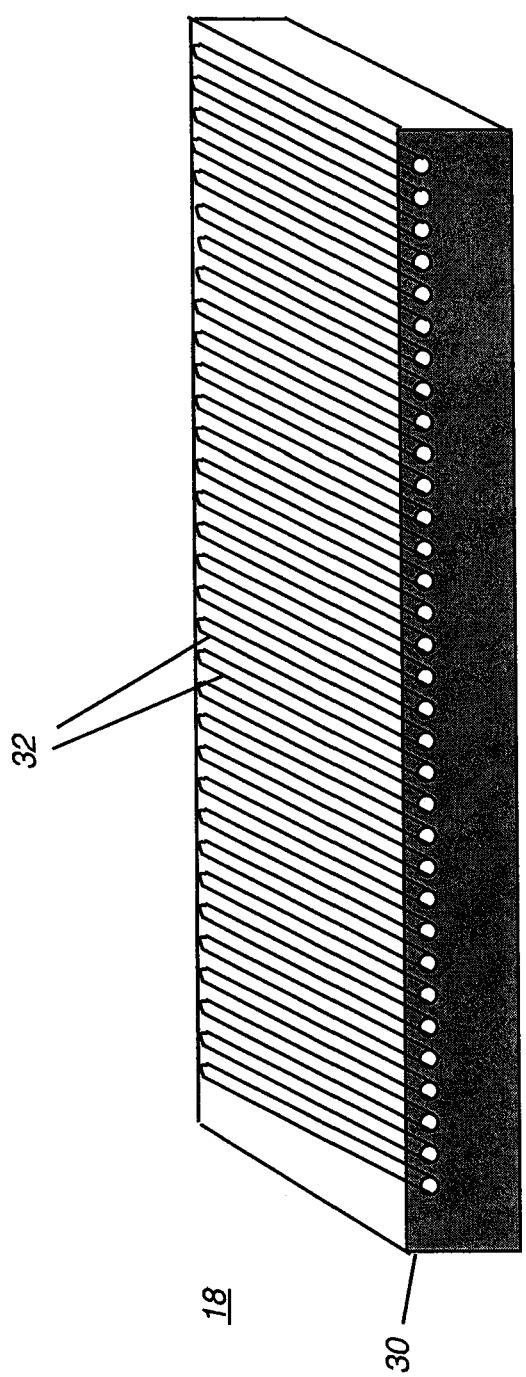
FIG. 2C is a perspective view of a composite carrier having an embedded material with a stranded structure and an orientation.
Figure 2D:
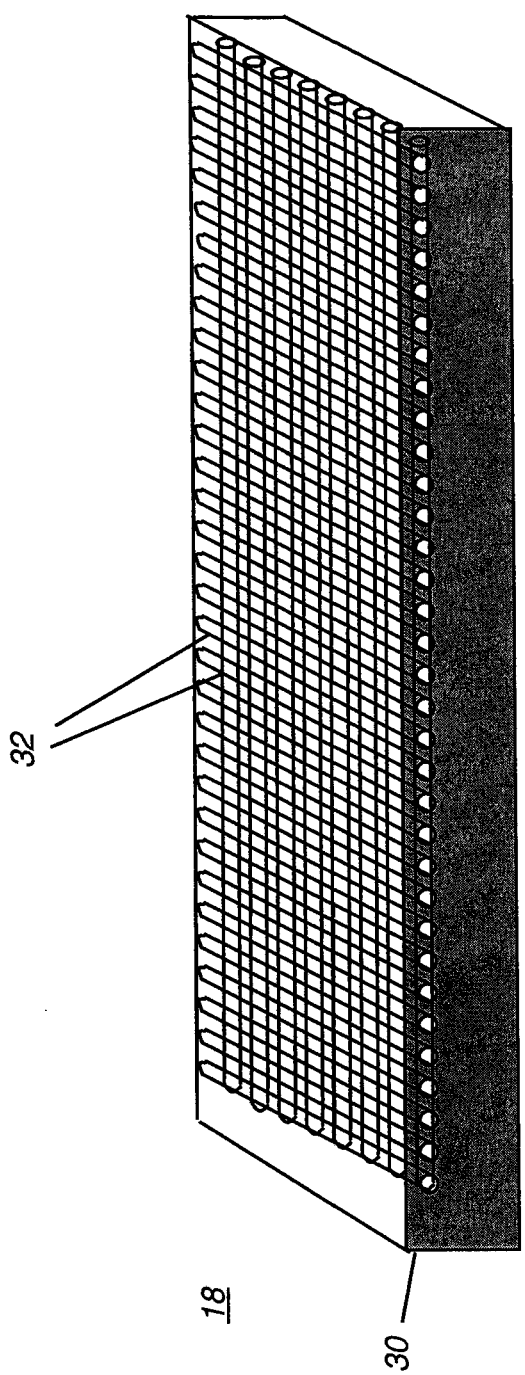
FIG. 2D is a perspective view of a composite carrier having an embedded material with a mesh structure.
Figure 2E:
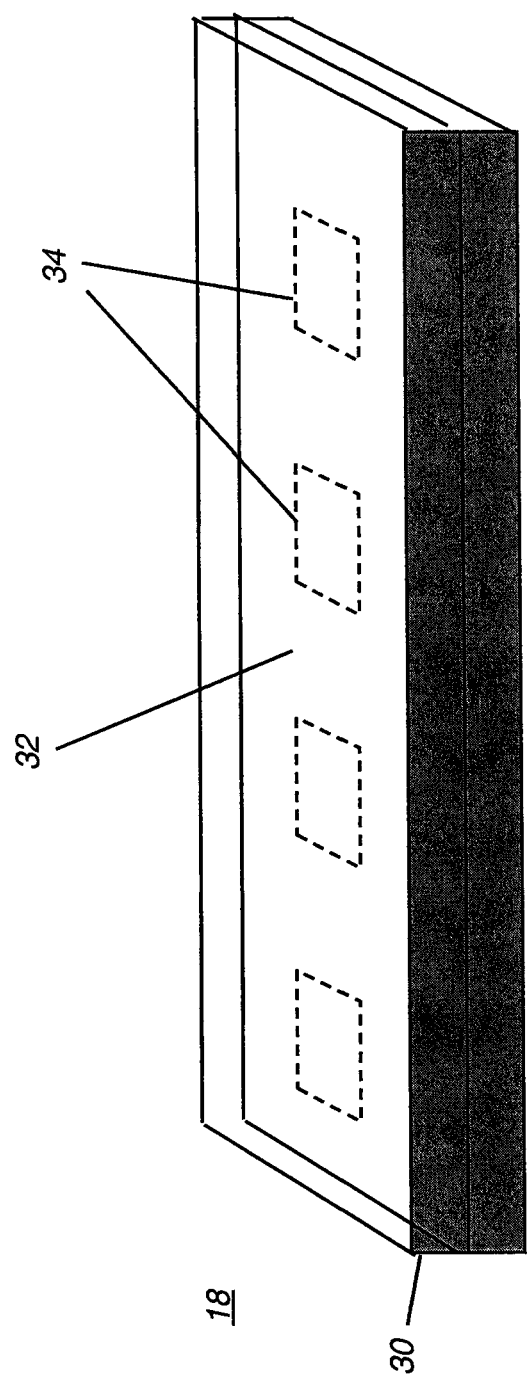
FIG. 2E is a perspective view of a composite carrier having an embedded sheet of plate material, with optional perforations.

FIGS. 2A, 2B, 2C, 2D, and 2E show some different arrangements for embodiments of composite carrier 18 of the present invention. Composite carrier 18 has a plastic binder 30 and an embedded material 32 that can take any of a number of forms. The cross-section view of FIG. 2A shows one embodiment in which embedded material 32 is a substantially uniform layer of particulate or stranded material that is embedded within binder 30. The cross-section view of FIG. 2B is similar; here, however, the distribution of particulate embedded material 32 is more random. Some portion of a particulate embedded material 32 can be exposed on the surface of carrier 18 that will come in contact with substrate 20, as described subsequently for adhesive applications. FIG. 2C is an orthogonal view showing embedded material 32 as a stranded structure, preferably oriented in a single direction. FIG. 2D shows embedded material 32 as a mesh with strands of material running in different directions. The strands may be interwoven, as in a screen. FIG. 2E shows embedded material 32 as a sheet or plate, possibly having one or more perforations 34. Other types of embedded materials and combinations of these different approaches could be used.

Binder materials can be selected from a range of plastic substances, based on desired properties. Some plastic binder materials of special interest include polyimide, as noted earlier, and polytetrafluoroethylene (PTFE) or poly(perfluoro-alboxy)fluoropolymer (PFA), known commercially as Teflon®, sold by DuPont, Inc.

Still other exemplary binder plastic materials include, but would not be limited to, heat-stabilized polyethylene terephthalate (HS-PET), polyethylenenapthalate (PEN), polycarbonate (PC), polyarylate (PAR), polyetherimide (PEI), polyethersulphone (PES), polyimide (PI) including Kapton®, Teflon® poly(perfluoro-alboxy)fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA). Suitable plastics for use as binder may also include various cyclic polyolefins, ARTON fabricated by JSR Corporation, Zeonor made by Zeon Chemicals L. P., and Topas made by Celanese AG. Other lower-temperature plastic substrates can also be used, including: ethylene-chlorotrifluoro ethylene (E-CTFE), marketed as HALAR from Ausimont U.S.A., Inc., ethylene-tetra-fluoroethylene (E-TFE) sold under the trademark TEFZEL by Dupont Corporation, poly-tetrafluoro-ethylene (PTFE), fiber glass enhanced plastic (FEP), and high density polyethylene (HDPE). Plastics that allow melting and undergo reflow at high temperatures can be particularly advantageous for their "self-laminating" capabilities, as described subsequently As known to those skilled in the device fabrication arts, neither polyimide nor PTFE, as conventionally formed and used by themselves, are inherently well-suited as carrier materials. However, when these materials are combined as binder materials with added embedded materials according to the present invention, they can provide carriers having highly favorable characteristics for supporting TFT circuitry.

Suitable particulate additive materials for use as embedded material 32 with the selected binder(s) include glass including spun-on glass, carbon, fibers, metal fibers, and plastics. Embedded material 32 could also be woven materials or fibers, such as woven fiberglass, for example. Embedded material 32 for carrier 18 may have a range of structural properties and shapes. Embedded material 32 may be particles of roughly spherical shape, platelets of dimension smaller than, or exceeding, the thickness of the substrate. Embedded material 32 could have elements that are elongated in shape, including wires, rods, mesh, or fibers for example. Ceramic fillers or other dielectric materials could be used for embedded material 32.

The addition of particulate materials to plastics in order to add favorable material properties is known in the art. Many of the plastic binders listed earlier are already available with added particulate in some form, so that the plastic material is adapted for use in various applications. For example, particulate materials are added to modify thermal characteristics of a plastic or to improve performance for machining. With particulate additives, certain plastic binder materials can withstand higher processing temperatures of up to at least about 200 degrees C., with some capable of withstanding temperatures of 300 degrees C. or higher without damage. When matching CTE values with this technique, there is an averaging of CTE values for both binder and embedded material components of composite carrier 18.

In yet other embodiments, compositions that include one or more of these plastic materials as binder may be a preferred solution. For example, it can be advantageous to combine a polyimide with polytetrafluoroethylene (PTFE) or poly(perfluoro-alboxy)fluoropolymer (PFA) in order to obtain the more favorable properties of both plastics. In addition, multiple embedded materials could be used.

Figure 3:
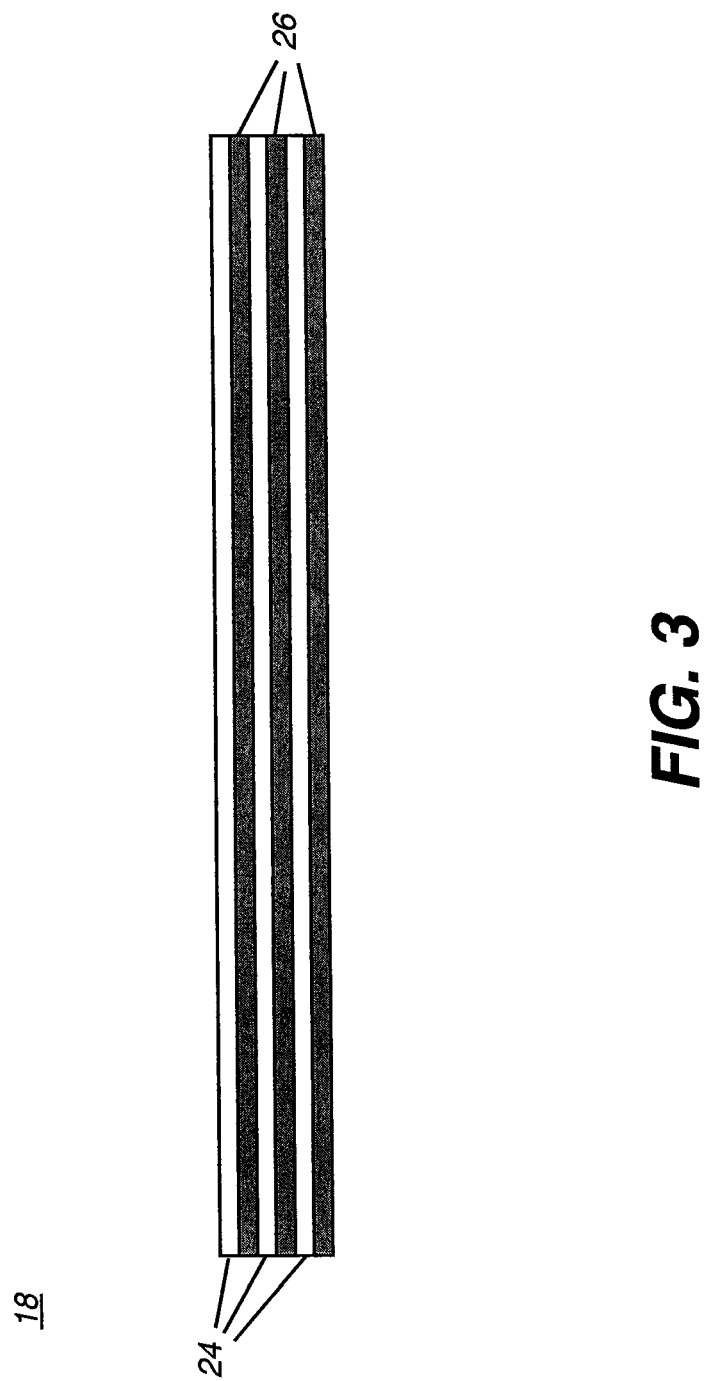
FIG. 3 is a cutaway view of a carrier having multiple layers.
Figure 4:
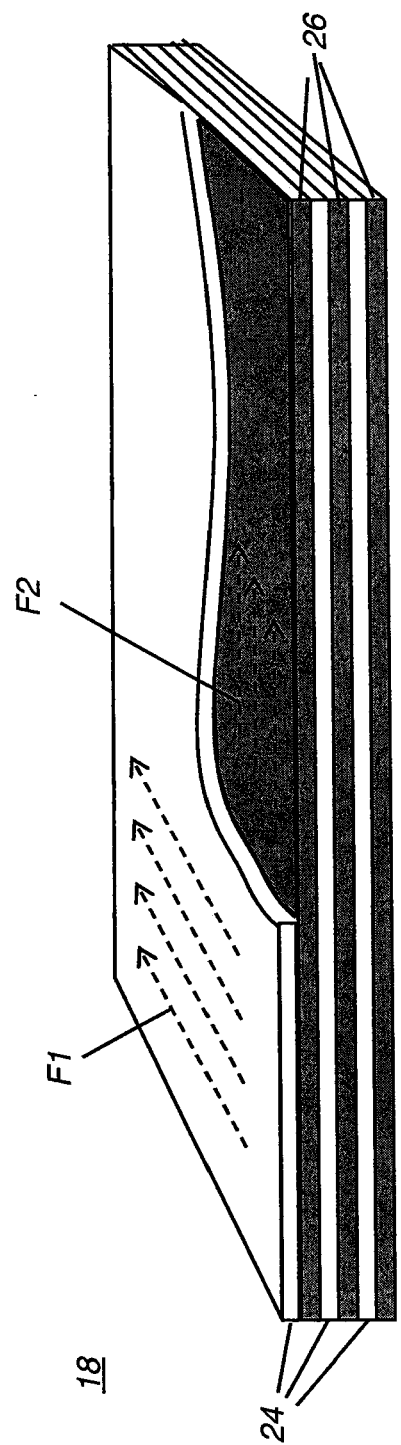
FIG. 4 is a perspective cutaway view of a carrier having multiple layers, with fibrous particulate material having an orientation that can vary with adjacent layers.

In some embodiments, it may be favorable to build up a composite structure for carrier 18 using multiple sandwiched layers. Referring to FIG. 3, there is shown a cross section of carrier 18 having multiple layers 24 and 26. Layers 24 and 26 can be formulated or configured in different ways or with different orientations to take advantage of desired characteristics. For example, a fibrous particulate composition can be used, with fibers within each layer 24 or 26 generally oriented in one direction. As shown in the partial cutaway perspective view of FIG. 4, fibrous particulate additive in layers 24 can be oriented in a first direction F1, as shown by dashed arrow lines. Fibrous particulate additive in layers 26 can be orientated in a second direction F2, shown generally orthogonal to direction F1. This arrangement, also used with the mesh embodiment shown in FIG. 2D, is advantaged for its enhanced rigidity.

The angular orientation of a fibrous or one-directional particulate additive material within the plastic binder material can also be varied in other ways. For example, elongated particulate materials could be dimensionally aligned, such as in a single direction or in layers of alternating directions, or aligned along two or more axes in a plane. Particulate materials can be oriented in a specific direction or pattern with respect to the surface of carrier 18, which may affect anisotropic optical, electronic, thermal, magnetic, chemical or physical properties. As just one example, fibers of embedded material 32 within the binder could be vertically oriented in order to guide light or heat in a vertical direction. Alternately, laterally oriented optical fibers could be used to guide light through composite carrier 18 in other directions.

One important advantage of composite carriers relates to the wide temperature range over which many types of such materials can be used. With some formulations, for example, deposition of substrate 20 onto composite carrier 18 can be performed, such as using sputtering, evaporation, or other methods for metals deposit.

Embodiments using PTFE for carrier 18 are advantaged due to capabilities of this material itself. One advantage relates to self-lamination, as noted earlier, by which reflow of the binder 30 material is used for lamination and de-lamination of substrate 20 to the carrier 18 surface.

EXAMPLE 1

In one embodiment, the material used for composite carrier 18 is a PTFE woven fiberglass laminate, such as a material from the DiClad 522, 527 Series available from Arlon, Inc. Rancho Cucamonga, Calif. Dimensionally stable under temperature stress, PTFE woven fiberglass laminates have been used, for example, for printed circuit boards (PCBs) and, when used for this purpose, are supplied with a copper layer, typically an electrodeposited copper layer. For carrier 18 of the present invention, no copper plating is used. An ideal thickness for PTFE woven fiberglass laminate is in the range of about 25 microns to about 3000 microns.

Given this material, TFT fabrication processing using a flexible substrate 20 is as follows:

1. Mounting on carrier 18. The flexible substrate 20 is initially laminated onto carrier 18. This is done by positioning substrate 20 on carrier 18 and treating this combination by applying heat and pressure to achieve the flow temperature (Tg) of the PTFE material of carrier 18, approximately 300 degrees C. The PTFE material softens, reflows, and bonds substrate 20 to the surface of carrier 18. Entrapped air between the carrier and substrate is forced out. Alternately, heat can be applied only to substrate 20 or to both substrate 20 and carrier 18. In another application, substrate 20 is not applied to carrier 18 until heating of carrier 18 to its flow temperature has been achieved.

2. Surface treatment. This next step, which may be optional depending on the materials used, conditions or treats the surface of substrate 20 in order to provide a suitable base to allow adhesion of layer 14. In one embodiment, layer 14 is a planarization layer, formed from silicon nitrate or other material. Layer 14 may alternately be another preparatory material or may include materials used in forming the thin-film electronic device itself.

3. Planarization. The desired surface roughness for TFT deposition can be on the order of less than 0.2 to 0.3 microns peak-to-peak in some applications. In order to achieve this, a thin coating of spun-on glass (SOG) is deposited. To apply this substance, a sol of colloidal silica particles in a solvent is applied to the surface of substrate 20. Temperature at 300-400 degrees C. is applied to cure the sol material, removing solvent and leaving a gel residue that, when itself heated, converts to an $SiO_2$ film having dielectric constant $\epsilon$ between about 3 and 5 and providing the necessary insulation and planarization needed prior to TFT deposition. Alternative planarization materials are familiar to those skilled in the TFT fabrication arts.

4. Forming electrical isolation layer. As a final surface preparation step for conditioning the surface of the substrate, which may be optional, an electrical isolation layer is deposited on top of the planarization layer. A suitable isolation layer material can be $SiO2$, $SiNx$, $SiON$, or some combination of these materials. This is typically in the range from about 0.5 to 1.5 µm.

5. Forming TFT elements. Following preparation of the surface of flexible substrate 20, the lay-down of TFT elements can begin.

This typically requires depositing a layer of thin-film semiconductor material onto the substrate, then forming a pattern by selective removal of portions of the semiconductor material. This procedure uses processes that are well known in the art of component fabrication for lay-down of gate, source, and drain components and other supporting layers.

6. Delamination or detachment from carrier 18. This may require application of heat at temperatures near the flow temperature of the plastic binder material used in carrier 18. This allows separation of substrate 20 from carrier 18. Once separated, substrate 20 can be laminated to some other surface or allowed to cool.

The method of Example 1 could be modified for specific substrate and component types. Other spin-coated dielectric treatments could alternately be used, for example. Steps 2, 3, and 4 could be combined as a single step, wherein an electrical isolation layer provides the needed measure of surface conditioning and planarization. Carrier 18 can then be re-used for supporting another substrate during fabrication.

Figure 5:
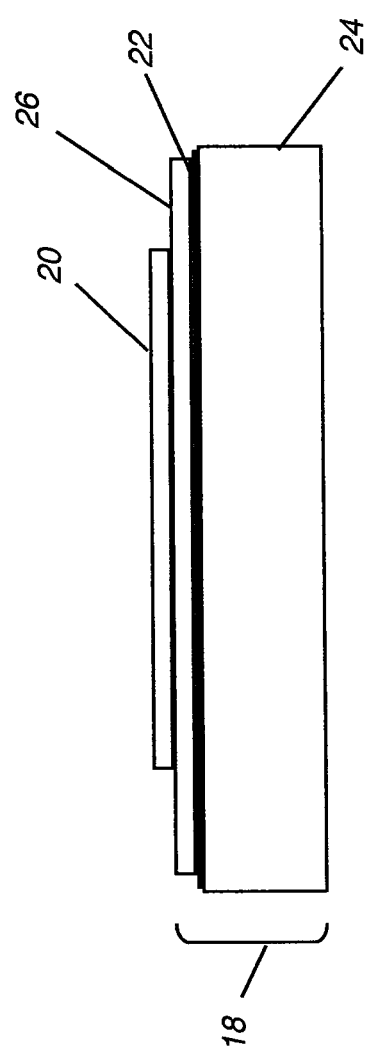
FIG. 5 is a side view of a composite carrier in another embodiment.

Referring to FIG. 5, there is shown an embodiment using composite carrier 18 that has a sheet of glass 24, a sheet of metal 22, and a layer of plastic 26 such as PTFE or other material that can be softened by heat. Irradiation by microwave or other heat application can be used to soften plastic 26 sufficiently for lamination of substrate 20. Carrier 18 can be designed to be absorbent to a range or band of electromagnetic wavelengths while substrate 20 is substantially transparent to the same band of wavelengths. Similarly, substrate 20 may be selected to be absorbent to electromagnetic radiation over a range of wavelengths while carrier 18 is substantially transparent to the same wavelength band.

EXAMPLE 2

In another embodiment, an adhesive could be used to temporarily support substrate 20 against carrier 18. Steps for TFT fabrication are then as follows:

1. Mounting on carrier 18. The flexible substrate 20 is adhesively affixed to carrier 18. This is done by coating an adhesive having suitable tackiness or peel strength onto either substrate 20 or carrier 18 or both. Pressure or heat and pressure can be used to adhere substrate 20 in place. Any entrapped air between the carrier and substrate is forced out.
2. Surface treatment. This next step, which may be optional depending on the materials used, conditions or treats the surface of substrate 20 in order to provide a suitable base to allow adhesion of layer 14. In one embodiment, layer 14 is a planarization layer, formed from silicon nitrate or other material. Layer 14 may alternately be another preparatory material or may include materials used in forming the thin-film electronic device itself.
3. Planarization. The desired surface roughness for TFT deposition can be on the order of less than 0.2 to 0.3 microns peak-to-peak in some applications. Planarization materials can be added to achieve this, as described previously.
4. Forming electrical isolation layer. As a final surface preparation step for conditioning the surface of the substrate, which may be optional, an electrical isolation layer is deposited on top of the planarization layer. A suitable isolation layer material can be SiO2, SiNx, SiON, or some combination of these materials. This is typically in the range from about 0.5 to 1.5 μm.
5. Forming TFT elements. Following preparation of the surface of flexible substrate 20, the lay-down of TFT elements can begin. This typically requires depositing a layer of thin-film semiconductor material onto the substrate, then forming a pattern by selective removal of portions of the semiconductor material. This procedure uses processes that are well known in the art of component fabrication for lay-down of gate, source, and drain components and other supporting layers.
6. Removal or detachment from carrier 18. Heat, radiation, or solvent can be used to free substrate 20 from adhesion to the surface of carrier 18, allowing separation of carrier 18 from substrate 20. Once separated, substrate 20 can be laminated or applied to some other surface or allowed to cool.

The method and apparatus of the present invention enable the use of a number of flexible materials as substrates for electronic devices, including metals such as stainless steel and nickel, for example. The ability to formulate a composite material having a binder with particulate material enables a closer thermal match to be obtained between the substrate and its carrier.

In matching substrate 20 to composite carrier 18, it is useful to observe the Coefficients of Thermal Expansion (CTE) between the two materials. With the apparatus and method of the present invention, it is possible to design and fabricate composite carrier 18 so that it is closely matched in CTE with its substrate 20. When CTE values are closely matched, adhesive can be used to stabilize substrate 20 in position against carrier 18, since only a small percentage of the surface areas of substrate 20 and carrier 18 are adhesively attached.

One way to closely match substrate 20 and composite carrier 18 CTE values is to use the same material used for substrate 20 as embedded material 32 and, in doing this, to provide a sufficient percentage of the same material within carrier 18. For example, in an embodiment using 304 stainless steel as substrate 20, composite carrier 18 is formed from PTFE as binder 30 with a 304 stainless steel mesh as embedded material 32. In this mesh, different layers of stainless steel wire extend in orthogonal directions, parallel to the carrier 18 surface. A composite carrier formed in this manner exhibits only the CTE of stainless steel for any movement in the plane of the carrier 18 surface. Some dimensional change with temperature may occur in a direction orthogonal to the carrier 18 surface, but this has a negligible effect on electronic device fabrication.

Methods for calculating the net effect of embedded materials on the overall CTE of carrier 18, including methods for determining how much embedded material 32 is needed by volume, are known to those skilled in the art. Techniques for sizing mesh, using wire diameter and percentage open area for a given material, are also known to those skilled in the art.

The use of a particulate material as embedded material 32 can be advantageous for applications using an adhesive, as in Example 2, described earlier. Many types of adhesive, for example, may not adhere to the surface of binder 30. For example, it is difficult to find adhesives suitable for a Teflon surface. However, particulate material that is embedded on the surface of a Teflon layer, as was described earlier with respect to the example of FIG. 2B, provides contact surfaces for epoxy or other adhesives.

Figure 6A:
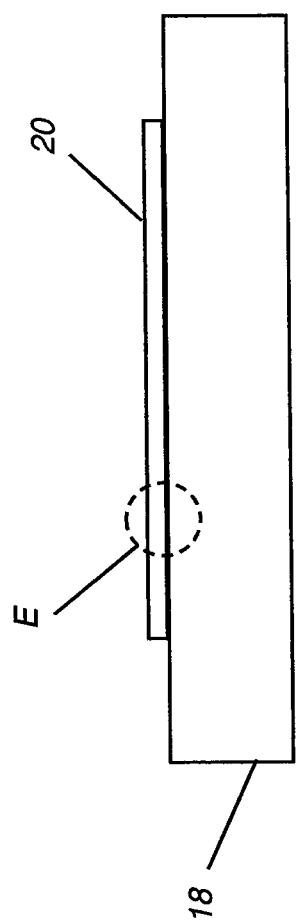
FIG. 6A is a side view showing a flexible substrate adhesively bonded to a composite carrier.
Figure 6B:
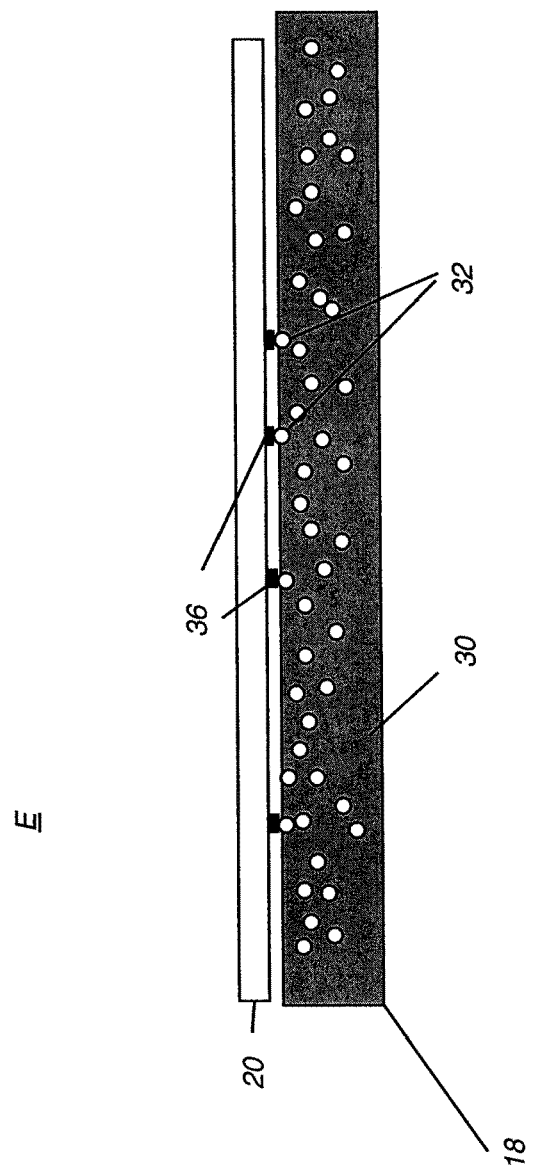
FIG. 6B is a side view enlargement of an area of the substrate and carrier interface shown in FIG. 6A.

FIG. 6A shows an embodiment in which substrate 20 is adhesively affixed to composite carrier 18. For this embodiment, substrate 20 and composite carrier 18 can have closely matched CTEs, obtained by introducing a suitable particulate material as embedded material 32 in binder 30, then conditioning the surface of carrier 18 to expose some of the particles. Enlarged area E is shown magnified in FIG. 6B. There is a small amount of an adhesive 36 at exposed embedded material 32 particles on the surface of carrier 18. Because of this small percentage of contact area and because the CTE of carrier and substrate are closely matched, substrate 20 can be readily affixed by adhesion at a number of points on the surface of carrier 18, rather than requiring adhesion of the full surface. Moreover, removal of substrate 20 after processing is simplified, since many types of adhesives soften with heat or with applied electromagnetic radiation over a suitable range. This point-by-point adhesion arrangement of FIG. 6B can be advantaged over full-surface adhesion, allowing substrate 20 to be held securely in place, but minimizing the risk of buckling or loosening of the bond due to conflicting thermal expansion rates. Methods such as oxygen- or plasma-etching may be used to expose a portion of the particulate materials used as embedded material 32.

Alternative methods for lamination may include use of pressure, as well as some combination using both heat and pressure. Solvent softening techniques could also be used. For example, where carrier 18 is formed from PTFE, a solvent such as a fluorinated hydrocarbon can be applied in order to soften the surface sufficiently for lamination of substrate 20. Heat can alternately be applied by methods such as baking or using a laser or other high intensity light source. Attachment by heating individual spots of carrier 18 using a laser is also possible.

In another embodiment, carrier 18 absorbs radiation at one band of wavelengths and substrate 20 is transparent to that same band of wavelengths. This allows radiant energy within the band of wavelengths to be delivered to the surface of carrier 18 through the transparent substrate 20. In another embodiment, carrier 18 may be transparent to a set of wavelengths that is then delivered to heat substrate 20. Or, carrier 18 may have an intermediate layer that absorbs radiation over a certain range of wavelengths.

In a similar fashion, delamination or detachment can include the use of heat, applied to either carrier 18, substrate 20, or both carrier 18 and substrate 20, as well as solvent materials. Pressure variation can also be used for de-lamination.

Advantageously, carrier 18 of the present invention, formed as a composite material, is reusable. In some embodiments, carrier 18 and substrate 20 can have one or more of the same binder or particulate additive materials in common, thereby providing an improved CTE match between carrier and substrate.

The electronic device formed on substrate 20 can be used to provide signals to or from any of a number of different types of components and would have particular applications for image display pixels or image sensing pixels. For example, the electronic device formed on the substrate 20 surface can be coupled with a corresponding liquid crystal pixel, light-emitting diode pixel, or organic light-emitting diode pixel for display, for example. For image sensing, the electronic device formed on the substrate 20 surface can be coupled with a stimulable phosphor pixel or with another type of sensor pixel, including a biological detector.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. Thus, what is provided is a carrier and a method for fabrication of an electronic device on a flexible substrate.

PARTS LIST 10 electronic device
12 thin-film component
14 layer
18 composite carrier
20 flexible substrate
22 metal sheet
24 layer
26 layer
30 plastic binder
32 embedded material
34 perforation
36 adhesive

The invention claimed is:

1. A method for forming an electronic device, the method comprising:
   forming a carrier comprising a plastic binder and embedding pieces of a material in the plastic binder;
   applying an adhesive coating on the carrier;
   attaching a substrate to the carrier using the adhesive coating therebetween;
   planarizing a surface of the substrate;
   forming the electronic device over the planarized surface of the substrate including depositing and patterning metal, semiconductor and insulator materials on the planarized surface of the substrate; and
   detaching the substrate with the electronic device from the carrier.

2. The method of claim 1 wherein attaching comprises laminating by heating the carrier surface, heating the substrate, or both.

3. The method of claim 1 wherein attaching comprises softening a surface of the carrier using a solvent.

4. The method of claim 1 wherein detaching comprises heating the carrier surface, heating the substrate, or both.

5. The method of claim 4 wherein heating causes the plastic binder to undergo a reflow condition.

6. The method of claim 1 wherein detaching comprises softening a surface of the carrier using a solvent.

7. The method of claim 1, wherein the carrier comprises a first layer of embedded material comprising a first plurality of elongated rods oriented substantially in parallel, and a second layer having a second plurality of elongated rods oriented substantially in parallel, and wherein the first plurality of elongated rods is oriented orthogonally to the second plurality of elongated rods.

8. The method of claim 1, wherein the substrate and the embedded material each comprise a same metal.

9. The method of claim 8, wherein the embedded material comprises a stainless steel mesh, the substrate comprises stainless steel foil, and the carrier comprises polytetrafluoroethylene.

10. The method of claim 1, wherein a difference between the coefficient of thermal expansion of the embedded material and of the substrate is within ±2 ppm/C °.

11. A method for forming an electronic device, the method comprising:
    forming a carrier comprising a binder and embedding pieces of a material in the binder;
    treating a surface of the carrier to expose portions of the embedded material above the surface of the carrier;
    applying an adhesive on the exposed portions of the embedded material;
    adhering a substrate layer only on a portion of the surface of the carrier including on the exposed portions of the embedded material using the adhesive on the exposed portions of the embedded material;
    forming the electronic device over the surface of the substrate layer including depositing and patterning metal, semiconductor and insulator materials on the surface of the substrate layer; and
    removing the substrate layer with the electronic device from the carrier.

12. The method of claim 11, wherein the plastic binder comprises polytetrafluoroethylene.

13. The method of claim 1, wherein the embedded material comprises fiberglass.

14. The method of claim 1, further comprising forming a carrier having multiple layers, wherein a first plurality of the multiple layers each comprises first embedded fibers selectively aligned in a first direction therein, and wherein a second plurality of the multiple layers each comprises second embedded fibers selectively aligned in a second direction therein.

15. The method of claim 14, wherein the first and second direction are offset by about 90 degrees and are each generally parallel with the planarized surface of the substrate.

16. The method of claim 15, further comprising alternating the layers having the first embedded fibers selectively aligned in the first direction with the layers having the second embedded fibers selectively aligned in the second direction to form the carrier having multiple layers.

17. The method of claim 11, further comprising forming a carrier having multiple layers, wherein a first plurality of the multiple layers each comprises the plastic binder and first embedded fibers selectively aligned in a first direction therein, and wherein a second plurality of the multiple layers each comprises the plastic binder and second embedded fibers selectively aligned in a second direction therein.

18. The method of claim 17, wherein the first and second direction are offset by about 90 degrees and are each generally parallel with the surface of the substrate.

19. The method of claim 17, further comprising alternating the layers having the first embedded fibers selectively aligned in the first direction with layers having the second embedded fibers selectively aligned in the second direction to form the carrier having multiple layers.

20. The method of claim 1, wherein the embedded material is selected from the group consisting of fibers, strands, mesh, interwoven material, a screen, platelets, elongated elements, wires, rods, and ceramic.

21. The method of claim 1, wherein the substrate is made from a substrate material that is either transparent to a preselected bandwidth of electromagnetic waves or is absorbent to the preselected bandwidth of electromagnetic waves, and wherein the carrier is made from a carrier material that is either absorbent to the preselected bandwidth of electromagnetic waves or is transparent to the preselected bandwidth of electromagnetic waves.

22. The method of claim 11, wherein the embedded material comprises a particulate material.

23. The method of claim 11, further comprising leaving a non-contact area between the surface of the carrier and the substrate layer after the step of adhering the substrate layer.

24. The method of claim 23, further comprising applying the adhesive point-by-point on the exposed portions of the embedded material and not applying the adhesive on at least a portion of the surface of the carrier.

25. The method of claim 11, further comprising applying the adhesive to a surface of the substrate facing the surface of the carrier.

* * * * *